US008574982B2

(12) United States Patent
Erickson et al.

(10) Patent No.: US 8,574,982 B2
(45) Date of Patent: Nov. 5, 2013

(54) IMPLEMENTING EDRAM STACKED FET STRUCTURE

(75) Inventors: Karl Robert Erickson, Rochester, MN (US); David Paul Paulsen, Dodge City, MN (US); John Edward Sheets, II, Zumbrota, MN (US); Kelly L. Williams, Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 745 days.

(21) Appl. No.: 12/712,521

(22) Filed: Feb. 25, 2010

(65) Prior Publication Data

US 2011/0204428 A1 Aug. 25, 2011

(51) Int. Cl.
*H01L 21/8249* (2006.01)

(52) U.S. Cl.
USPC .......... 438/234; 438/235; 438/287; 438/341; 257/278; 257/324; 257/330; 257/331; 257/366; 257/370; 257/374; 257/378; 257/396; 257/401; 257/512; 257/E21.614; 257/E21.616; 257/E21.629; 257/E27.026; 365/185.17; 365/185.33

(58) Field of Classification Search
USPC ......... 257/278, 324, 330, 331, 366, 369, 370, 257/373, 374, 378, 390, 396, 397, 401, 499, 257/512, 903, E21.614, E21.616, E21.619, 257/E21.629, E21.696, E27.064, E27.065, 257/E27.108, E27.015, E27.026, E29.183; 438/234, 235, 287, 341; 365/185.17, 365/185.33
See application file for complete search history.

(56) References Cited

U.S. PATENT DOCUMENTS

| | | | |
|---|---|---|---|
| 3,535,599 A | 10/1970 | Deak | |
| 4,500,905 A | 2/1985 | Shibata | |
| 5,012,306 A | 4/1991 | Tasch, Jr. et al. | |
| 5,093,275 A | 3/1992 | Tasch, Jr. et al. | |
| 5,312,768 A | 5/1994 | Gonzalez | |
| 6,392,253 B1 | 5/2002 | Saxena | |
| 7,002,207 B2 | 2/2006 | Kim et al. | |
| 7,282,406 B2 | 10/2007 | Grivna et al. | |
| 7,355,237 B2 | 4/2008 | Lutze et al. | |
| 7,537,980 B2 | 5/2009 | Son et al. | |
| 7,560,379 B2 | 7/2009 | Kohli et al. | |
| 7,713,828 B2 | 5/2010 | Yuki | |
| 2002/0096690 A1 | 7/2002 | Nemati et al. | |
| 2006/0054943 A1* | 3/2006 | Li et al. ........................ | 257/266 |
| 2006/0252191 A1 | 11/2006 | Kammler et al. | |
| 2007/0111414 A1 | 5/2007 | Chaudhry et al. | |
| 2007/0184572 A1 | 8/2007 | Kohli et al. | |
| 2009/0114997 A1 | 5/2009 | Tong et al. | |
| 2009/0224368 A1 | 9/2009 | Sudo | |
| 2010/0252868 A1 | 10/2010 | Allen et al. | |
| 2010/0308413 A1 | 12/2010 | Paone et al. | |
| 2011/0204428 A1 | 8/2011 | Erickson et al. | |
| 2012/0032274 A1 | 2/2012 | Erickson et al. | |

OTHER PUBLICATIONS

IBM Patent U.S. Appl. No. 12/416,264, David H. Allen, et al., "Enhanced Field Effect Transistor" filed Apr. 1, 2009.
IBM Patent U.S. Appl. No. 12/478,098, Phil C. Paone, et al., "3-D Single Gate Inverter" filed Jun. 4, 2009.

* cited by examiner

Primary Examiner — Meiya Li
(74) Attorney, Agent, or Firm — Joan Pennington

(57) ABSTRACT

A method and circuit for implementing an embedded dynamic random access memory (eDRAM), and a design structure on which the subject circuit resides are provided. The embedded dynamic random access memory (eDRAM) circuit includes a stacked field effect transistor (FET) and capacitor. The capacitor is fabricated directly on top of the FET to build the eDRAM.

5 Claims, 15 Drawing Sheets

100

| BARE WAFER
102
(Si LAYER) |
|---|

IMPLEMENTING EDRAM STACKED FET STRUCTURE

FIELD OF THE INVENTION

The present invention relates generally to the data processing field, and more particularly, relates to a method and circuit for implementing an embedded dynamic random access memory (eDRAM) including a stacked field effect transistor (FET) and capacitor in an area normally consumed by a FET device alone, and a design structure on which the subject circuit resides.

DESCRIPTION OF THE RELATED ART

Two of the key metrics for semiconductor product success is affordability, generally governed by chip area, and performance, as measured by frequency.

Traditional embedded dynamic random access memory (eDRAM) devices have limitations in their packing density since each eDRAM must occupy unique real estate and has higher fabrication cost with lower yields with the tradeoff for larger bandwidth and less power.

A need exists for a method and apparatus for implementing improved embedded dynamic random access memory (eDRAM) devices.

SUMMARY OF THE INVENTION

Principal aspects of the present invention are to provide a method and circuit for implementing an embedded dynamic random access memory (eDRAM), and a design structure on which the subject circuit resides. Other important aspects of the present invention are to provide such method, circuit and design structure substantially without negative effect and that overcome many of the disadvantages of prior art arrangements.

In brief, a method and circuit for implementing an embedded dynamic random access memory (eDRAM), and a design structure on which the subject circuit resides are provided. The embedded dynamic random access memory (eDRAM) circuit includes a stacked field effect transistor (FET) and capacitor. The capacitor is fabricated directly on top of the FET to build the eDRAM.

In accordance with features of the invention, selective metal stack and dielectric deposition techniques on top of a gate conductor are utilized to allow for a vertical integration, allowing the stacking of the FET and capacitor devices.

In accordance with features of the invention, a two layer metal stack with a high-K dielectric material, such as hafnium dioxide ($HfO_2$), above and below each metal layer are deposited on a starting semiconductor wafer, such as Si layer. The metal stack is etched to form a gate stack of the eDRAM with a silicon dioxide ($SiO_2$) spacer film deposited on the gate stack. The $SiO_2$ spacer film is etched and source and drain regions are implanted.

In accordance with features of the invention, a first epitaxial (epi) silicon layer is grown and an oxygen implant step is performed, providing an isolation $SiO_2$ spacer layer. In a first embodiment, the isolation $SiO_2$ spacer layer separates both the top drain (S/D) diffusions from the bottom source and drain regions. In another embodiment, the isolation $SiO_2$ separates the top drain diffusion from the bottom drain region. The $SiO_2$ spacer film is etched further and another high-K dielectric material $HfO_2$ thin spacer is deposited. The high-K dielectric material $HfO_2$ thin spacer is etched, and growing the epitaxial (epi) silicon layer is continued, and the structure is planarized.

In accordance with features of the invention in the first embodiment, a respective pair of contact holes is etched and a respective metal contact is deposited in a first unlined contact hole to the source region. A silicon dioxide ($SiO_2$) line is deposited in the second lined contact hole and the bottom of the second lined contact hole is etched to the drain region, and then a second metal contact is deposited.

In accordance with features of the invention in the other embodiment, a single contact hole is etched. A contact on the source side is not required since an isolation $SiO_2$ was not formed above the source region. A silicon dioxide ($SiO_2$) liner is deposited in the single contract hole and the bottom of the contact hole is etched. A metal contact is deposited in the lined contact hole.

In accordance with features of the invention, a word line is the gate connection of the FET, a bit line contacts a drain side of FET S/D diffusion and an opposite side or source side contacts to the capacitor formed on top of the FET.

In accordance with features of the invention, the stacked field effect transistor (FET) and capacitor is built in an area normally consumed by a FET device alone.

BRIEF DESCRIPTION OF THE DRAWINGS

The present invention together with the above and other objects and advantages may best be understood from the following detailed description of the preferred embodiments of the invention illustrated in the drawings, wherein:

FIGS. 1, 2, 3, 4, 5A, 6A, 7A and 8A illustrate exemplary structures and process steps for fabricating embedded dynamic random access memory (eDRAM) circuits in accordance with the preferred embodiment;

DETAILED DESCRIPTION OF THE PREFERRED EMBODIMENTS

Figure 2:
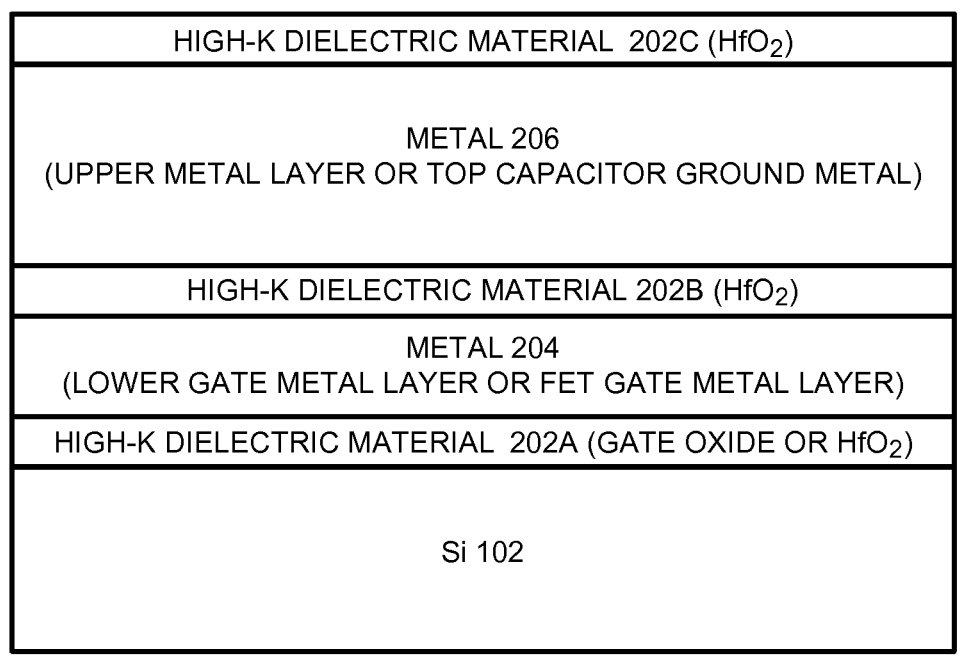

In accordance with features of the invention, an enhanced fabrication method and an improved embedded dynamic random access memory (eDRAM) circuit are provided.

In accordance with features of the invention, selective metal stack and dielectric deposition techniques on the top of a gate conductor are utilized to allow for a vertical integration, allowing the stacking of unique devices. The present invention allows fabrication of a capacitor directly on top of a field effect transistor (FET) to build an eDRAM in the area normally consumed by a FET device alone.

In accordance with features of the invention, a traditional polysilicon gate transistor or a more advanced high-k dielectric, metal gate transistor on either bulk or SOI prior to the addition of the over transistor dielectric films and additional metal layers can be used. The invention is illustrated assuming a planar structure built via traditional process and includes a metal gate and high-k dielectric device in accordance with the preferred embodiment for this invention.

Having reference now to the drawings, in FIGS. 1-4, 5A, 6A, 7A and 8A, there are shown exemplary structures and processing steps for fabricating an embedded dynamic random access memory (eDRAM) stacked circuit in accordance with a preferred embodiment. FIGS. 5B, 6B, 7B and 8B, there are shown alternative exemplary structures and processing steps for fabricating an embedded dynamic random access memory (eDRAM) stacked circuit in accordance with another preferred embodiment.

Figure 1:
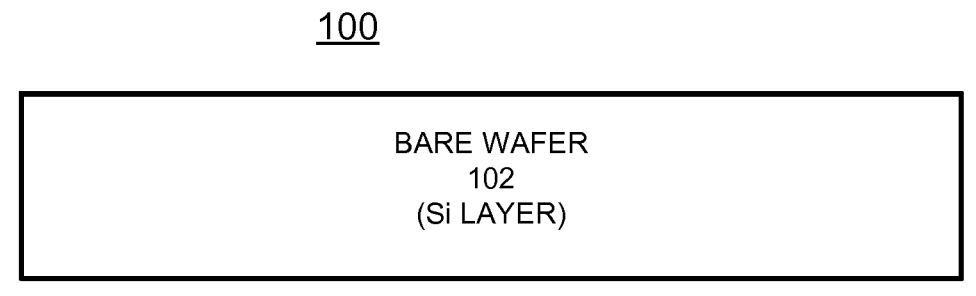

In FIG. 1, a first processing step generally designated by the reference character 100 begins with a bare wafer 102, such as bulk silicon, silicon-on-insulator or another semiconductor material, as shown a silicon layer 102 or Si 102.

In FIG. 2, a next processing step provides a stack generally designated by the reference character 200 includes a two layer metal stack with high-K dielectric material 202A, 202B, 202C, such as hafnium dioxide $HfO_2$, respectively deposited above and below each metal layer 204 and 206. The metal layer 204 forms a lower gate metal layer 204 that is implemented by common technology for fabricating field effect transistors (FETs) or FET gate metal layer 204, for example, having a thickness of approximately 50 Å or 5.0 nm. The high-K dielectric material 202A forming a gate oxide 202 that has a thickness of approximately 50 Å or 5.0 nm.

The upper metal layer 206 implementing a capacitor ground metal 206 above the field effect transistor (FET) that has a selected thickness of, for example, at least approximately 500 Å or 50 nm. The high-K dielectric material or hafnium dioxide $HfO_2$ 202B between the metal layers 204 and 206 has a thickness of approximately 50 Å or 5.0 nm.

The metal layer 204 forming FET gate metal layer 204 and metal layer 206 forming capacitor ground metal 206 are not elementally metal, and typically includes a 400 Å or 40 nm poly-silicon layer with a 100 Å or 10 nm layer of tantalum, tungsten, or another metal.

Figure 3:
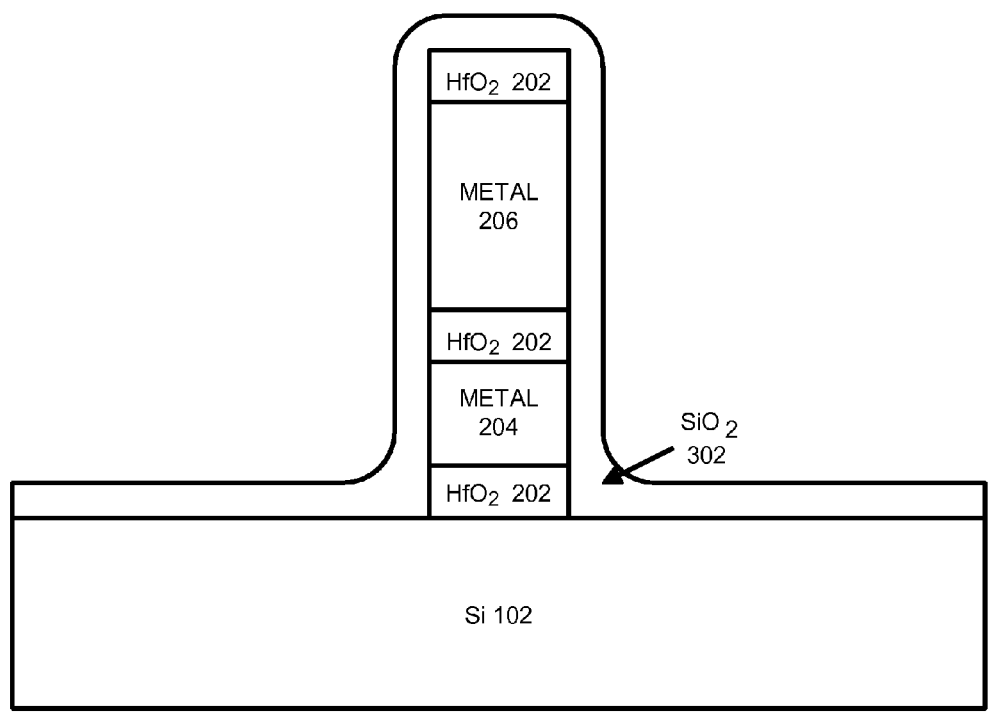

Referring to FIG. 3, there are shown next processing steps providing an etched metal gate stack generally designated by the reference character 300 to form the base gate stack of the eDRAM. A $SiO_2$ spacer film 302 is deposited above the metal gate stack 300.

Figure 4:
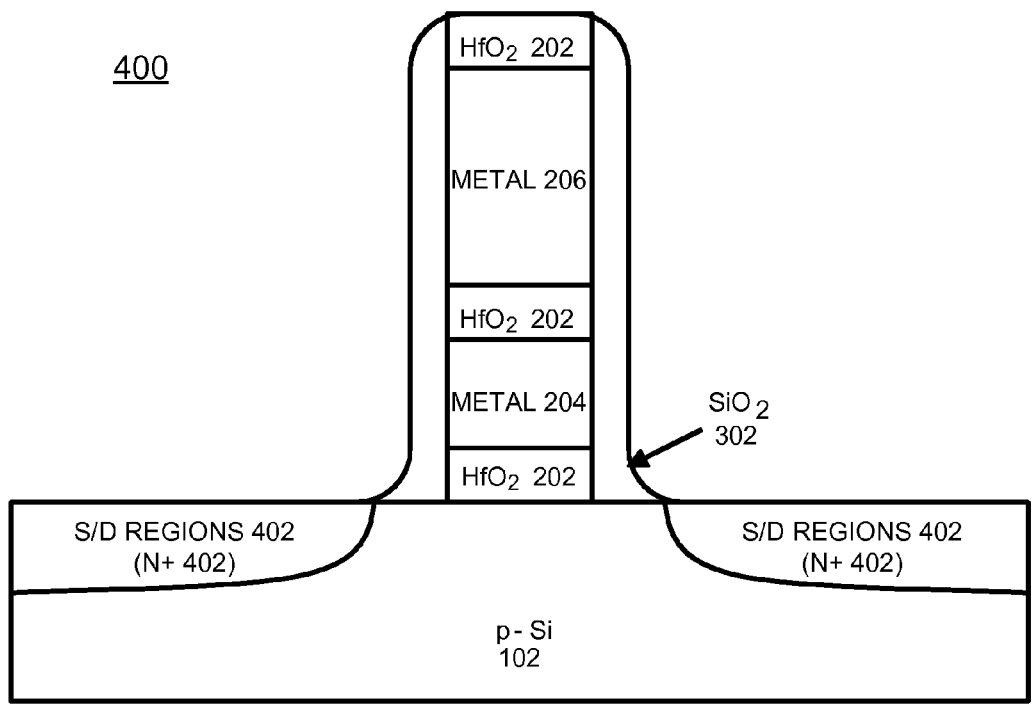

Referring to FIG. 4, there is shown a next structure generally designated by the reference character 400 where processing steps include the $SiO_2$ spacer film 302 isotropically etched preceding the implantation of the source and drain (S/D) regions 402. The implantation of the source/drain S/D regions 402 are S/D diffusion regions 402 that utilizes a conventional or traditional process.

Figure 5A:
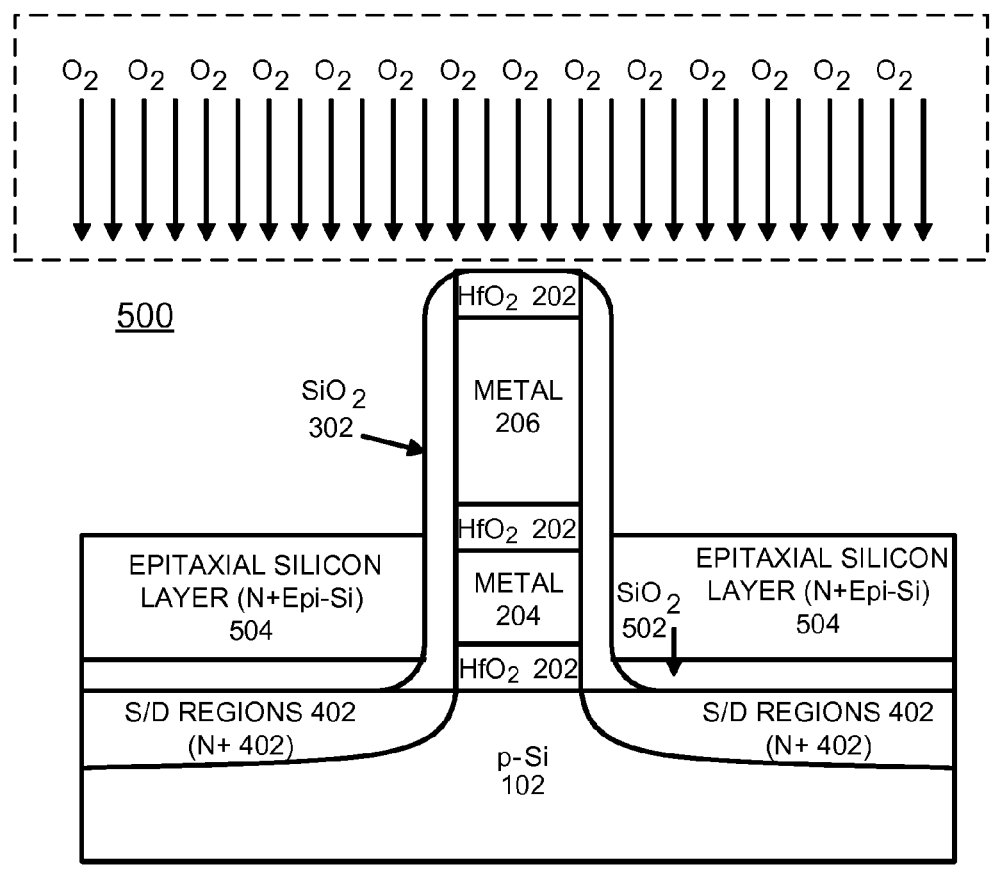

Referring to FIG. 5A, there is shown a next structure generally designated by the reference character 500. Structure 500 includes a $SiO_2$ layer 502 and a first epitaxial silicon (N+ Epi-Si) layer 504. The processing steps include growing the first epitaxial silicon layer 504 grown, followed by oxygen implant process indicated by arrows labeled $O_2$ where large quantities of oxygen are provided to form the $SiO_2$ layer 502 to completely separate the top FET diffusions formed by N+Epi-Si layer 504 from the bottom FET diffusions of the S/D regions 402.

Figure 5B:
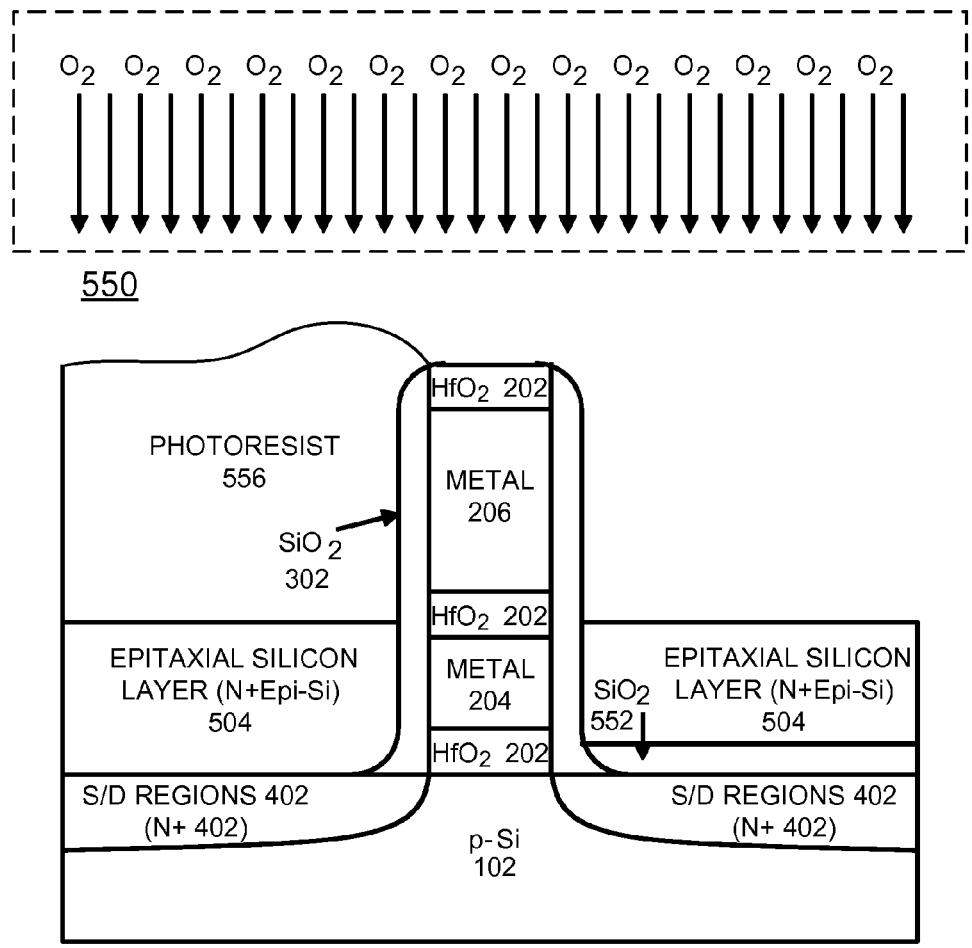
FIGS. 5B, 6B, 7B and 8B illustrate alternative exemplary structures and process steps for fabricating embedded dynamic random access memory (eDRAM) circuits in accordance with another preferred embodiment.

Referring to FIG. 5B, there is shown an alternative next structure generally designated by the reference character 550. Structure 550 includes a $SiO_2$ layer 552, a first epitaxial silicon (N+Epi-Si) layer 554 and a photoresist 556. The processing steps include growing the first epitaxial silicon (N+Epi-Si) layer 554 grown, followed by oxygen implant process indicated by arrows labeled $O_2$ where large quantities of oxygen are provided to form the $SiO_2$ layer 552 to completely separate the top FET diffusion formed by N+Epi-Si layer 554 from the bottom FET drain diffusion of the S/D regions 402, without the isolation $SiO_2$ layer on the source diffusion of the S/D regions 402 side below the photoresist 556 on the left-side of FIG. 5B.

Figure 6A:
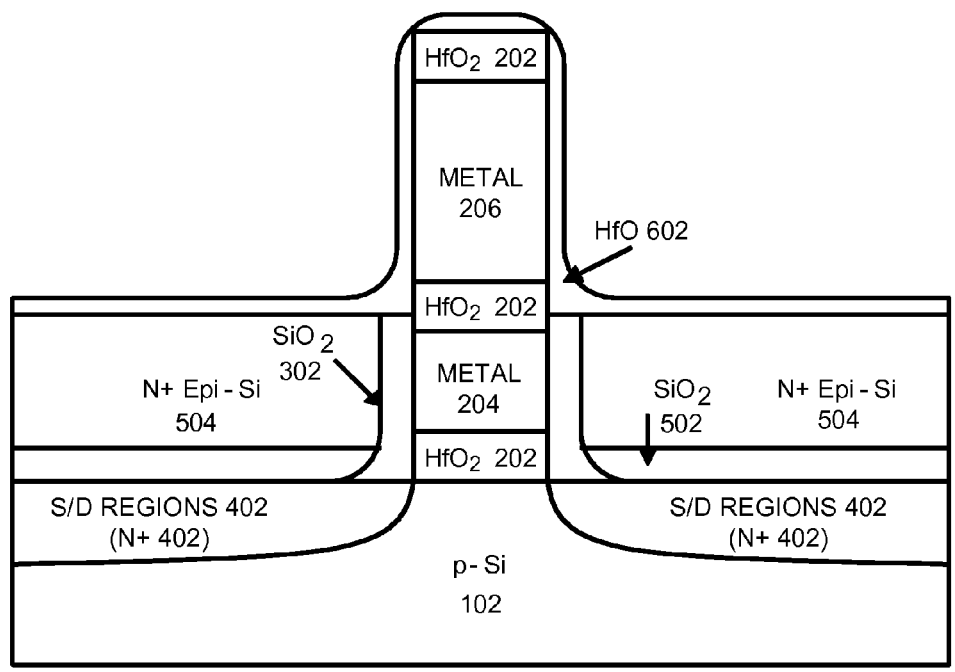

Referring to FIG. 6A, there is shown a next structure generally designated by the reference character 600. Structure 600 includes a further isotropic etch of the $SiO_2$ spacer film 302 before another high-K dielectric material $HfO_2$ thin spacer 602 is deposited.

Figure 6B:
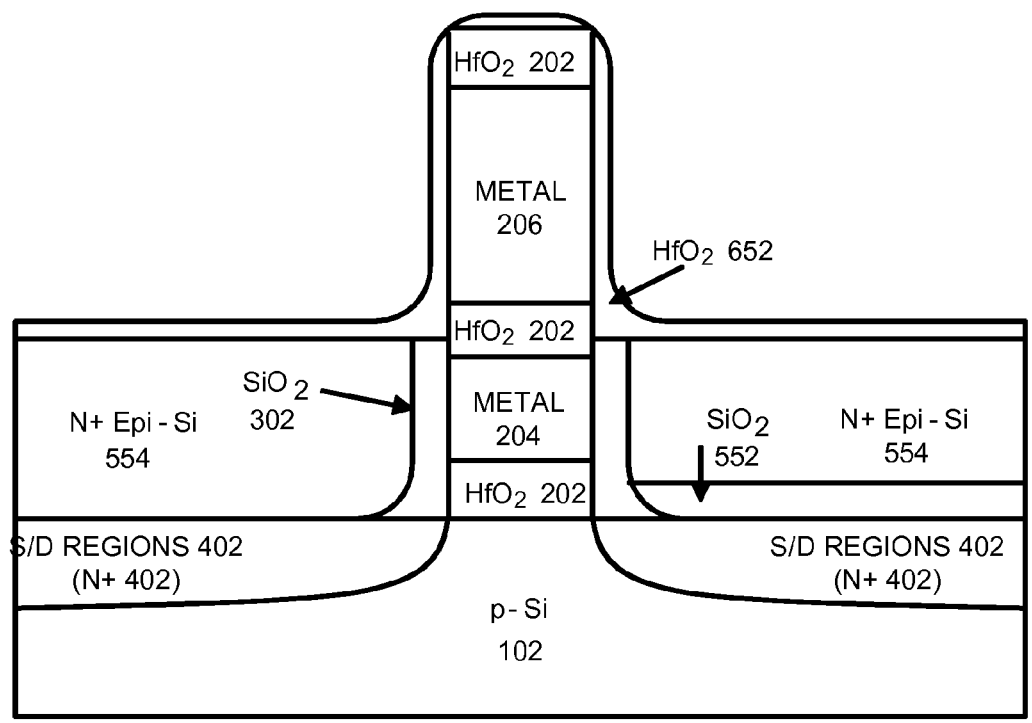

Referring to FIG. 6B, there is shown an alternative next structure generally designated by the reference character 650. Structure 650 includes a further isotropic etch of the $SiO_2$ spacer film 302 before another high-K dielectric material $HfO_2$ thin spacer 652 is deposited.

Figure 7A:
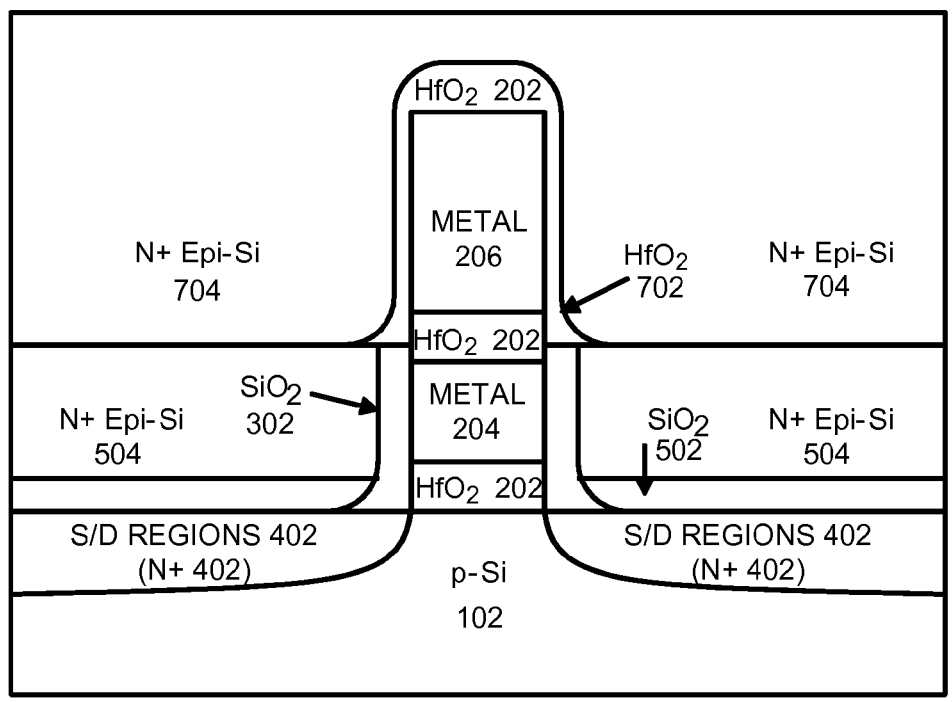

Referring to FIG. 7A, there is shown a next structure generally designated by the reference character 700. Structure 700 includes one more anisotropic etch of the HfO spacer 702. The HfO spacer 702 forms a high-K dielectric material $HfO_2$ thin spacer 702 that is etched, and the epitaxial (epi) silicon layer 704 is grown to continue the epi silicon layer 504, and the structure 700 is planarized.

Figure 7B:
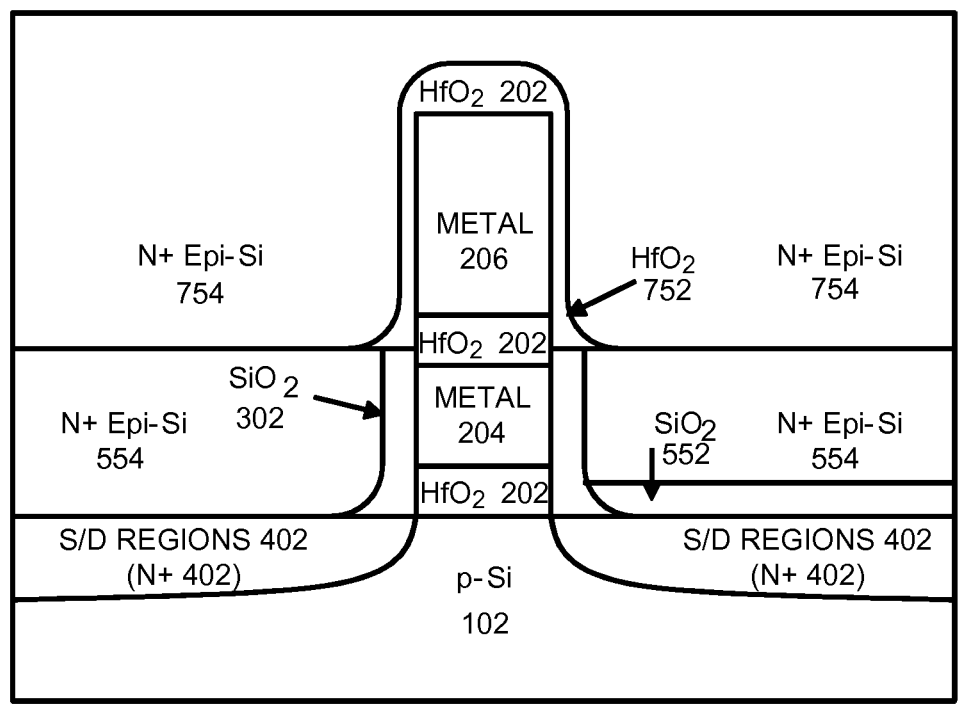

Referring to FIG. 7B, there is shown an alternative next structure generally designated by the reference character 750. Structure 750 includes one more isotropic etch of the HfO spacer 752. The HfO spacer 752 forms a high-K dielectric material $HfO_2$ thin spacer 752 that is etched, and the epitaxial (epi) silicon layer 754 is grown to continue the epi silicon layer 554, and the structure 750 is planarized.

Figure 8A:
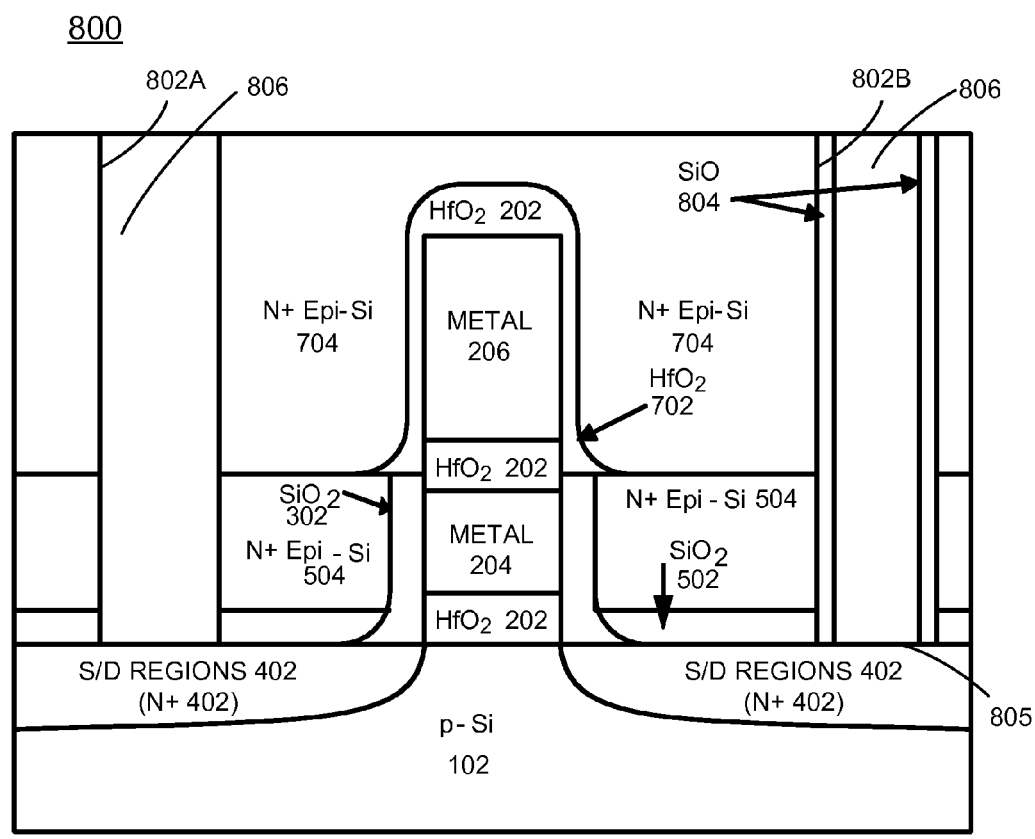

FIG. 8A shows a next structure generally designated by the reference character 800. Structure 800 is the final eDRAM devices stack including all the necessary connections. The processing steps include etching a respective first and second contact holes 802A, 802B to the S/D diffusion regions 402. As shown on the right side of FIG. 8A, the second etched contact hole 802B is lined, where a silicon dioxide ($SiO_2$) liner 804 is deposited and the silicon dioxide ($SiO_2$) liner 804 at a bottom 805 of the contact hole 802B is etched. A respective metal contact 806 is deposited in the respective first unlined contact hole 802A and the second lined contact hole 802B to complete the eDRAM structure 800. The eDRAM word line is provided by the gate connection of the FET. The eDRAM bit line is connected to the FET diffusion drain side and the opposite side or source side is connected to the capacitor defined above of the FET.

Figure 8B:
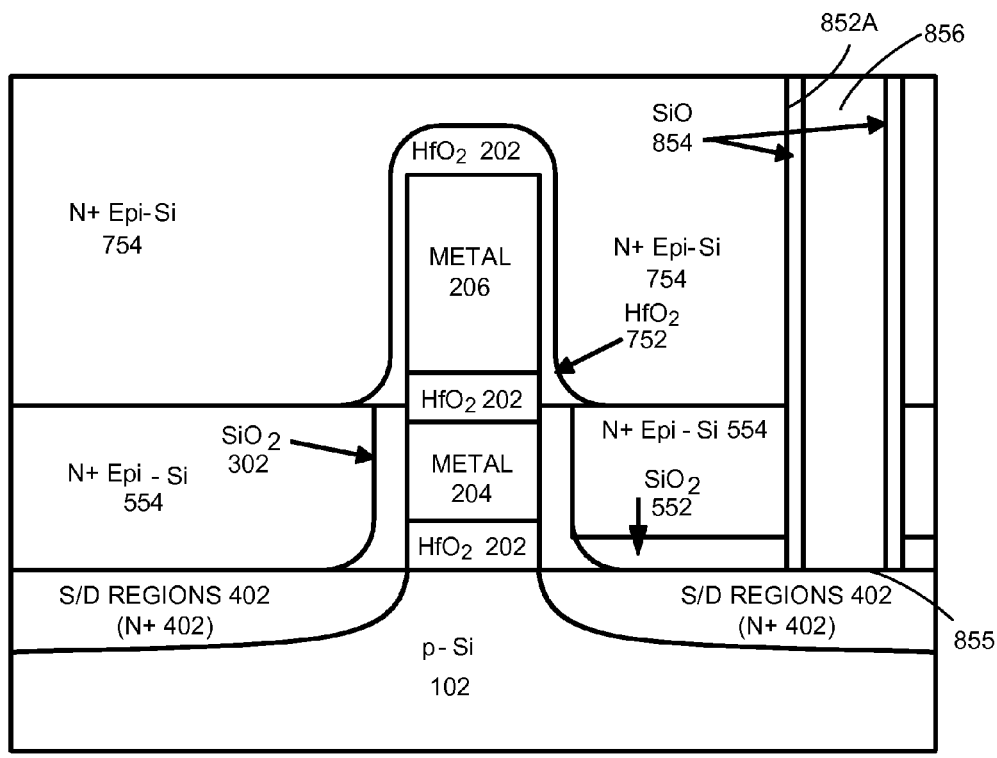

FIG. 8B shows an alternative next structure generally designated by the reference character 850. Structure 850 is the alternative final eDRAM devices stack including all the necessary connections. The processing steps include etching a single contact hole 852. A contact on the source side is not required since an isolation $SiO_2$ spacer layer was not formed in FIG. 5B. As shown on the right side of FIG. 8B, the single contact hole 852 is lined, where a silicon dioxide ($SiO_2$) liner 854 is deposited and the bottom 855 of the contact hole 852 is etched. A metal contact 856 is deposited in the lined contact hole 852 to complete the eDRAM structure 850. The eDRAM word line is provided by the gate connection of the FET. The eDRAM bit line is connected to the FET diffusion drain side and the opposite side or source side is connected to the capacitor defined above of the FET.

Figure 9A:
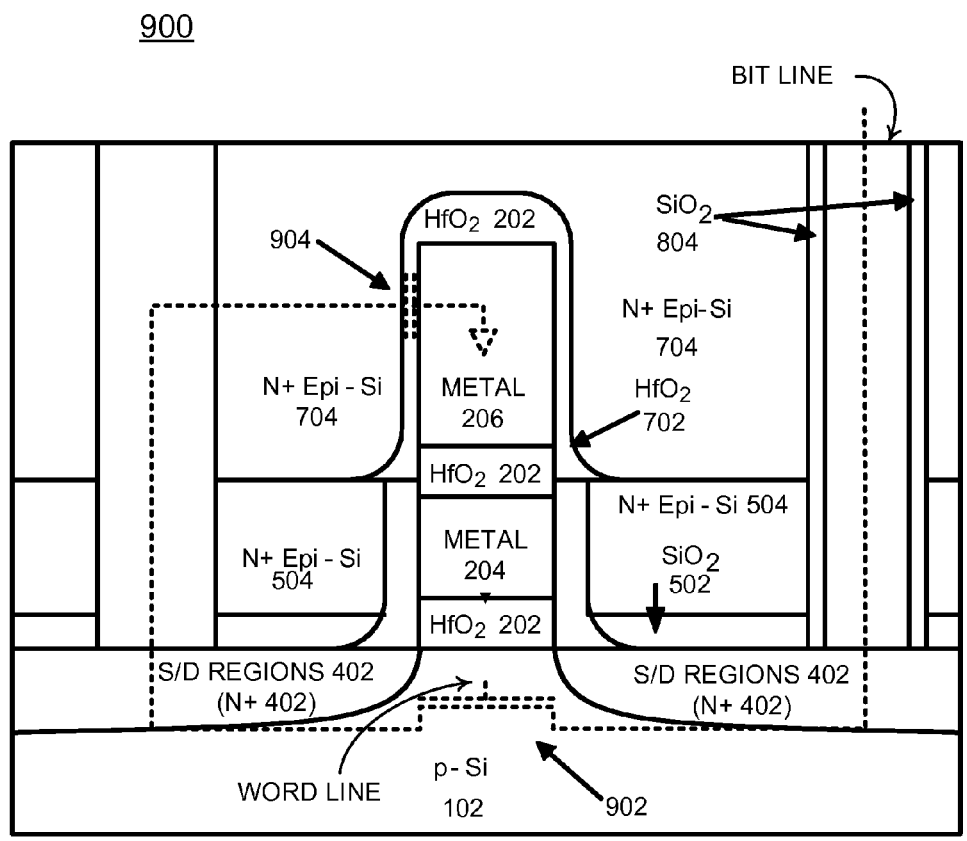
FIG. 9A schematically illustrates the eDRAM circuit with the completed eDRAM circuit of FIG. 8A in accordance with the preferred embodiment.

Referring to FIG. 9A, the eDRAM device 800 of FIG. 8A is schematically illustrated and generally designated by the reference character 900. The eDRAM 900 includes a schematically illustrated FET 902 and a schematically illustrated capacitor 904. A word line is the gate connection of the FET 902, a bit line contacts a drain side of FET S/D diffusion 402 as shown on the right side of FIG. 9A and an opposite side or source side contacts to the capacitor 904 formed above of the FET 902.

Figure 9B:
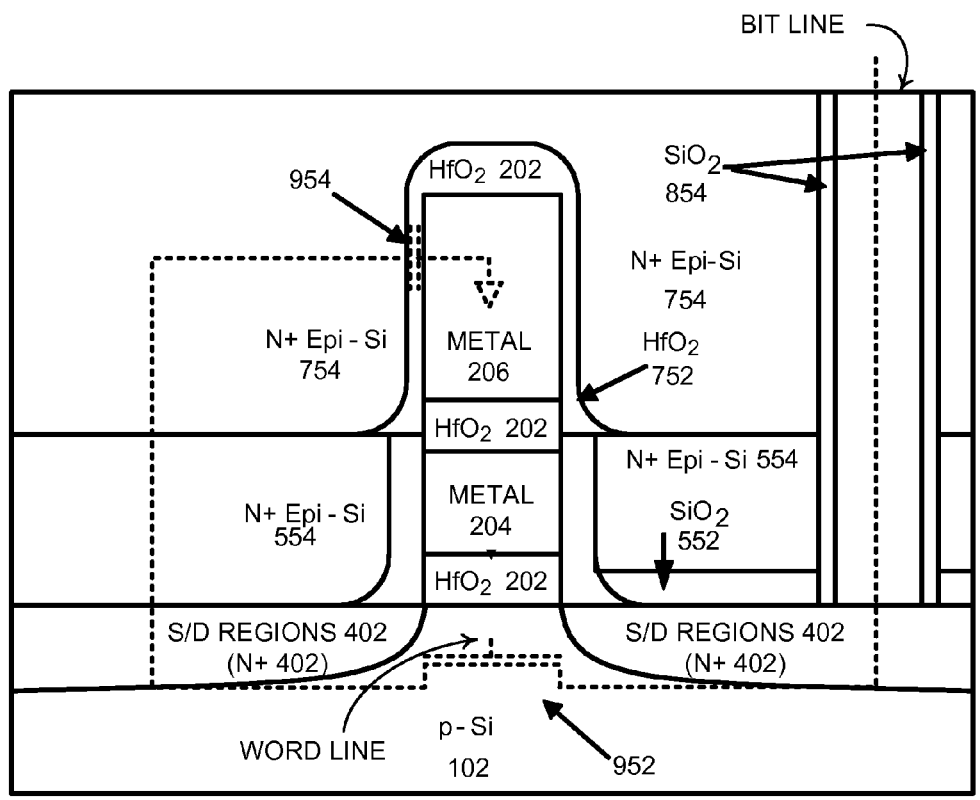
FIG. 9B schematically illustrates the eDRAM circuit with the completed eDRAM circuit of FIG. 8B in accordance with the preferred embodiment.

Referring to FIG. 9B, the eDRAM device 850 of FIG. 8B is schematically illustrated and generally designated by the reference character 950. The eDRAM 950 includes a schematically illustrated FET 952 and a schematically illustrated capacitor 954. A word line is the gate connection of the FET 952, a bit line contacts a drain side of FET S/D diffusion 402 as shown on the right side of FIG. 9B and an opposite side or source side contacts to the capacitor 954 formed above of the FET 952.

Figure 10:
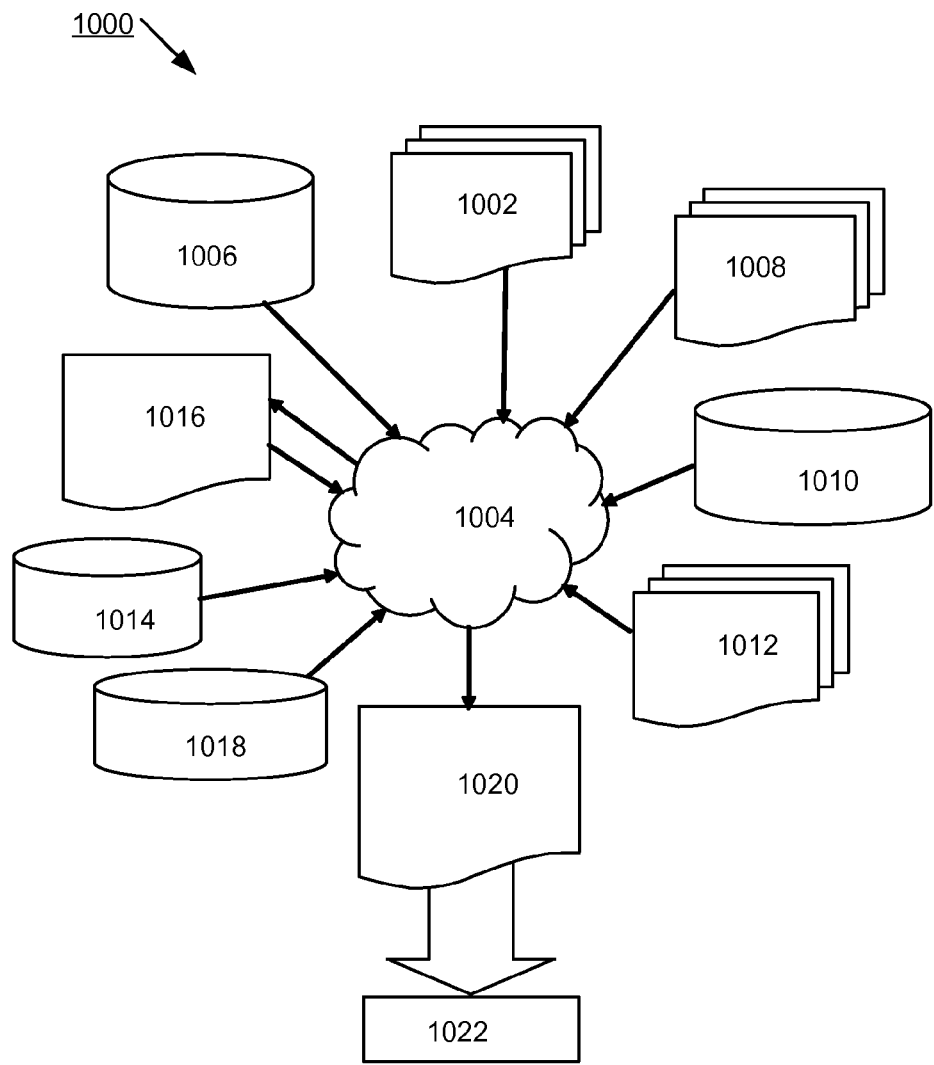
FIG. 10 is a flow diagram of a design process used in semiconductor design, manufacturing, and/or test.

FIG. 10 shows a block diagram of an example design flow 1000 that may be used for high speed serial link circuit and the interconnect chip described herein. Design flow 1000 may vary depending on the type of IC being designed. For example, a design flow 1000 for building an application specific IC (ASIC) may differ from a design flow 1000 for designing a standard component. Design structure 1002 is preferably an input to a design process 1004 and may come from an IP provider, a core developer, or other design company or may be generated by the operator of the design flow, or from other sources. Design structure 1002 comprises circuits 800, 850 in the form of schematics or Hardware Description Language (HDL), a hardware-description language, for example, Verilog, VHSIC Hardware Description Language (VHDL) where VHSIC is Very High Speed Integrated Circuit, C, and the like. Design structure 1002 may be contained on one or more machine readable medium. For example, design structure 1002 may be a text file or a graphical representation of circuits 800, 850. Design process 1004 preferably synthesizes, or translates, circuits 800, 850 into a netlist 1006, where netlist 1006 is, for example, a list of wires, transistors, logic gates, control circuits, I/O, models, etc. that describes the connections to other elements and circuits in an integrated circuit design and recorded on at least one of machine readable medium. This may be an iterative process in which netlist 1006 is resynthesized one or more times depending on design specifications and parameters for the circuits.

Design process 1004 may include using a variety of inputs; for example, inputs from library elements 1008 which may house a set of commonly used elements, circuits, and devices, including models, layouts, and symbolic representations, for a given manufacturing technology, such as different technology nodes, 32 nm, 45 nm, 90 nm, and the like, design specifications 1010, characterization data 1012, verification data 1014, design rules 1016, and test data files 1018, which may include test patterns and other testing information. Design process 1004 may further include, for example, standard circuit design processes such as timing analysis, verification, design rule checking, place and route operations, and the like. One of ordinary skill in the art of integrated circuit design can appreciate the extent of possible electronic design automation tools and applications used in design process 1004 without deviating from the scope and spirit of the invention. The design structure of the invention is not limited to any specific design flow.

Design process 1004 preferably translates embodiments of the invention as shown in FIGS. 1-4, 5A, 6A, 7A, 8A, and 5B, 6B, 7B, 8B along with any additional integrated circuit design or data (if applicable), into a second design structure 1020. Design structure 1020 resides on a storage medium in a data format used for the exchange of layout data of integrated circuits, for example, information stored in a GDSII (GDS2), GL1, OASIS, or any other suitable format for storing such design structures. Design structure 1020 may comprise information such as, for example, test data files, design content files, manufacturing data, layout parameters, wires, levels of metal, vias, shapes, data for routing through the manufacturing line, and any other data required by a semiconductor manufacturer to produce embodiments of the invention as shown in FIGS. 1-4, 5A, 6A, 7A, 8A, and 5B, 6B, 7B, 8B. Design structure 1020 may then proceed to a stage 1022 where, for example, design structure 1020 proceeds to tape-out, is released to manufacturing, is released to a mask house, is sent to another design house, is sent back to the customer, and the like.

While the present invention has been described with reference to the details of the embodiments of the invention shown in the drawing, these details are not intended to limit the scope of the invention as claimed in the appended claims.

What is claimed is:

1. A method for implementing an embedded dynamic random access memory (eDRAM) circuit comprising:
    forming a stacked structure including a field effect transistor (FET) and a capacitor;
    said capacitor being disposed above said FET in said stacked structure; and forming said stacked structure includes:
        depositing a first high-K dielectric material layer on a semiconductor substrate layer; depositing a first metal layer, depositing a second high-K dielectric material layer on the first metal layer; depositing a second metal layer, depositing a third high-K dielectric material layer on the second metal layer; and etching said first and second metal layers stack to define a gate stack of said FET of the eDRAM;
    depositing a silicon dioxide ($SiO_2$) spacer film on said third high-K dielectric material layer of said gate stack;
    implanting source and drain regions in said semiconductor substrate layer adjacent said gate stack forming a source and drain of said FET;
    growing a first epitaxial (epi) silicon layer on said silicon dioxide ($SiO_2$) spacer film on said third high-K dielectric material layer of said gate stack to define to source and drain (S/D) diffusions in said first epitaxial (epi) silicon layer and performing an oxygen implant step to separate said top source and drain (S/D) diffusions from said source and drain regions in said semiconductor layer.

2. The method for implementing the embedded dynamic random access memory (eDRAM) circuit as recited in claim 1 wherein forming said stacked structure further includes etching said $SiO_2$ spacer film to remove said $SiO_2$ spacer film from said first epitaxial (epi) silicon layer and said second metal of said gate stack and depositing a high-K dielectric material thin spacer layer on said first epitaxial (epi) silicon layer and on said second metal layer of said gate stack.

3. The method for implementing the embedded dynamic random access memory (eDRAM) circuit as recited in claim 2 wherein depositing said high-K dielectric material thin spacer layer on said first epitaxial (epi) silicon layer and on said second metal layer of said gate stack includes depositing a $HfO_2$ thin spacer layer.

4. The method for implementing the embedded dynamic random access memory (eDRAM) circuit as recited in claim 3 wherein forming said stacked structure further includes etching said high-K dielectric material thin spacer layer deposited on said first epitaxial (epi) silicon layer, growing a second epitaxial (epi) silicon layer to continue said first epitaxial (epi) silicon layer, and planarizing said stacked structure.

5. The method for implementing the embedded dynamic random access memory (eDRAM) circuit as recited in claim 4 wherein forming said stacked structure includes etching a first contact hole and a second contact hole through said second epitaxial (epi) silicon layer and said first epitaxial (epi) silicon layer respectively to said source and drain regions in said semiconductor layer; depositing silicon dioxide ($SiO_2$) in said second contact hole, and depositing a first metal contact in said first contact hole and depositing a second metal contact in said second lined contact hole; said first metal contact coupled to said capacitor above said FET.

* * * * *